(12) United States Patent
Hwu

(10) Patent No.: US 11,876,543 B2
(45) Date of Patent: Jan. 16, 2024

(54) MIXER CIRCUIT, TRANSMITTER AND COMMUNICATION DEVICE

(71) Applicant: HANGZHOU GEO-CHIP TECHNOLOGY CO., LTD., Hangzhou (CN)

(72) Inventor: Sy-Chyuan Hwu, Hangzhou (CN)

(73) Assignee: Hangzhou Geo-chip Technology Co., Ltd., Hangzhou (CN)

( * ) Notice: Subject to any disclaimer, the term of this patent is extended or adjusted under 35 U.S.C. 154(b) by 230 days.

(21) Appl. No.: 17/388,533

(22) Filed: Jul. 29, 2021

(65) Prior Publication Data
US 2023/0033769 A1 Feb. 2, 2023

(51) Int. Cl.
H04B 1/04 (2006.01)
H03D 7/00 (2006.01)
H03M 1/66 (2006.01)
H04B 1/10 (2006.01)

(52) U.S. Cl.
CPC .......... H04B 1/04 (2013.01); H03D 7/00 (2013.01); H03M 1/66 (2013.01)

(58) Field of Classification Search
None
See application file for complete search history.

(56) References Cited

U.S. PATENT DOCUMENTS

| | | | |
|---|---|---|---|
| 2008/0280585 A1* | 11/2008 | Chen | H04B 1/30 455/341 |
| 2011/0189970 A1* | 8/2011 | Ohshiro | H04B 1/10 455/302 |
| 2012/0262320 A1* | 10/2012 | Mitani | H03M 3/404 330/69 |
| 2013/0113567 A1* | 5/2013 | Igarashi | H03F 3/45071 330/261 |
| 2014/0111252 A1* | 4/2014 | Zhuo | H03D 7/12 327/109 |
| 2022/0052652 A1* | 2/2022 | Jussila | H03F 1/565 |

FOREIGN PATENT DOCUMENTS

| | | | | |
|---|---|---|---|---|
| CN | 104104333 A | * | 10/2014 | |
| CN | 103457616 B | * | 5/2015 | |
| CN | 109470936 A | * | 3/2019 | G01R 29/26 |
| WO | WO-2022078581 A1 | * | 4/2022 | |

* cited by examiner

*Primary Examiner* — Pablo N Tran
(74) *Attorney, Agent, or Firm* — Nixon & Vanderhye P.C.

(57) ABSTRACT

The present disclosure provides a mixer circuit, a transmitter, and a communication device. The mixer circuit comprises an I-channel digital-to-analog converter, a Q-channel digital-to-analog converter, a low-pass filter, and a passive quadrature mixer, wherein the low-pass filter comprises an active device, so that an output admittance of the mixer circuit contains conductance dependent of frequency. The consistency between the gains of the mixer circuit at the upper sideband and the lower sideband can be improved.

7 Claims, 4 Drawing Sheets

MIXER CIRCUIT, TRANSMITTER AND COMMUNICATION DEVICE

TECHNICAL FIELD

The present disclosure relates to the field of communication technology, and in particular, to a mixer circuit, a transmitter, and a communication device.

TECHNICAL BACKGROUND

In the related art, an I-channel digital-to-analog converter and a Q-channel digital-to-analog converter (which respectively provide baseband signals having a phase difference of 90°) are connected to a mixer through a low-pass filter composed of a resistor and a capacitor. The mixer modulates the baseband signals from the I-channel digital-to-analog converter and the Q-channel digital-to-analog converter into radio frequency signals, which are then provided to a power amplifier subsequent to the mixer in order for the power amplifier to drive an antenna to emit electromagnetic waves.

The mixers include passive quadrature mixers and active quadrature mixers. Although the passive quadrature mixers have better linearity and lower noise than the active quadrature mixers, the gains of the passive quadrature mixers with respect to the upper sideband and the lower sideband of the mixed frequency differentiate significantly.

SUMMARY OF THE INVENTION

The purpose of the present disclosure is to provide a mixer circuit, transmitter and communication device in order to solve the defects of the prior art.

In order to solve the above technical problems, the present disclosure provides a technical solution in which a mixer circuit comprises an I-channel digital-to-analog converter, a Q-channel digital-to-analog converter, a low-pass filter, and a passive quadrature mixer, where the passive quadrature mixer is configured to generate a radio frequency signal based on an output of the I-channel digital-to-analog converter, and an output of the Q-channel digital-to-analog converter and a local oscillation signal, the low-pass filter is arranged ahead of the passive quadrature mixer, so that low-pass filtered signals are received between an I-channel non-inverting input terminal and a Q-channel non-inverting input terminal of the passive quadrature mixer and between an I-channel inverting input terminal and a Q-channel inverting input terminal of the passive quadrature mixer, respectively. The low-pass filter includes an active device, so that an output admittance of the mixer circuit contains conductance dependent of frequency.

In order to solve the above technical problems, the present disclosure provides a technical solution in which a transmitter comprises an antenna, a power amplification circuit, and the mixer circuit, where the passive quadrature mixer is configured to provide the mixed radio frequency signal to the power amplification circuit, and the power amplification circuit is configured to amplify the received radio frequency signal and provide the amplified radio frequency signal to the antenna.

In order to solve the above technical problems, the present disclosure provides a technical solution in which a communication device comprises the transmitter.

Compared with the prior art, the present disclosure can provide the following technical effects. Conventionally, the load of the mixer circuit is typically a power amplifier, the input admittance of which is typically independent of frequency, and the output admittance of the mixer circuit is dependent of frequency. In contrast, for the mixer circuit of the present disclosure, the output conductance is also dependent of frequency, the sum of the output admittance of the mixer circuit and the input admittance of the load determines the gain of the mixer circuit, and the real and imaginary parts of the sum of the output admittance of the mixer circuit and the input admittance of the load are both dependent of frequency, as a result, in adjusting the mixer circuit, the modulus of the sum of the output admittance of the mixer circuit and the input admittance of the load can be equal or nearly equal with respect to the upper and lower sidebands of the mixed frequency of the mixer circuit, so that the gains of the mixer circuit tend to be constant with the change of frequency.

DETAILED DESCRIPTION OF THE EMBODIMENTS

In the present disclosure, it should be understood that terms such as "comprising" and "having" indicate the presence of a feature, a number, a step, an operation, a component, a part or any combination thereof as described in the specification, but does not exclude a possibility of the presence of one or more other features, numbers, steps, operations, components, parts or combinations thereof.

In addition, it should be noted that the embodiments in the application and the features in the embodiments can be combined with each other if there is no conflict. Hereinafter, the present disclosure will be described in detail with reference to the accompanying drawings and in conjunction with the embodiments.

Figure 1:
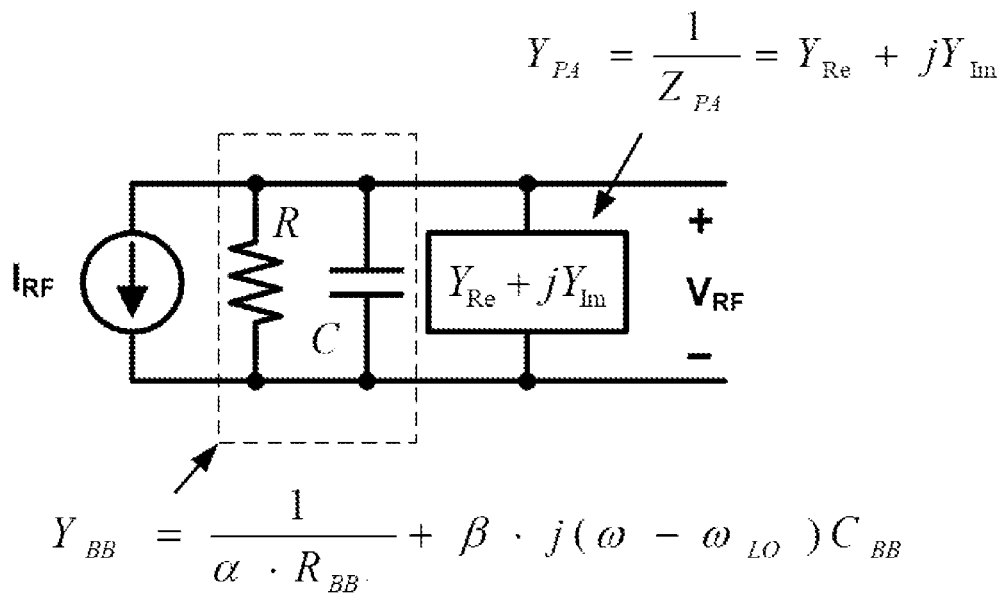
FIG. 1 is an equivalent circuit of a mixer circuit in the related art.

Referring to FIG. 1 which shows an equivalent circuit of a mixer circuit in the related art. When studying the existing mixer circuit, the inventor of the present disclosure found that, if a low-pass filter composed of passive components is connected between signal sources (i.e., an I-channel digital-to-analog converter and a Q-channel digital-to-analog converter) and a passive quadrature mixer, the equivalent circuit of the mixer circuit includes a current source $I_{RF}$ and an output resister R and an output capacitor C which are driven by the current source $I_{RF}$. Here, the output admittance of the mixer circuit is denoted as $Y_{BB}$, the input impedance of the power amplifier connected to the mixer circuit is denoted as $Z_{P4}$, the input admittance of the power amplifier is denoted as $Y_{P4}$, and the input voltage received by the power amplifier is denoted as $V_{RF}$.

Thus, the output admittance $Y_{BB}$ of the current source $I_{RF}$ can be determined according to the equation below.

$$Y_{BB} = \frac{1}{\alpha \cdot R_{BB}} + \beta \cdot j(\omega - \omega_{LO})C_{BB}$$

Here, α and β are coefficients, $R_{BB}$ is a resistance value of the equivalent resister of the low-pass filter, ω is an angular frequency, $\omega_{LO}$ is an angular frequency of the carrier, and $C_{BB}$ is the capacitance value of the equivalent capacitor of the low-pass filter.

It can be found that, the real part $Y_{Re}$ and the imaginary part $Y_{Im}$ of the input admittance $Y_{PA}$ of the power amplifier are substantially constant, the real part of the output admittance $Y_{BB}$ of the current source $I_{RF}$ is a constant value, and the imaginary part of the output admittance $Y_{BB}$ of the current source $I_{RF}$ is a value dependent of frequency. Accordingly, the values of the imaginary parts of $Y_{BB}$ with respect to the upper sideband and the lower sideband are not equal to each other.

At the upper sideband, the admittance of all loads of the current source $I_{RF}$ is denoted as $Y_{USB}$ and can be expressed according to the equations below.

$$Y_{USB} = \frac{1}{\alpha \cdot R_{BB}} + Y_{Re} + j(Y_{Im} + \beta \cdot \omega_{BB} C_{BB})$$

In the lower sideband, the admittance of all loads of the current source $I_{RF}$ is denoted as $Y_{LSB}$ and can be expressed according to the equations below.

$$Y_{LSB} = \frac{1}{\alpha \cdot R_{BB}} + Y_{Re} + j(Y_{Im} - \beta \cdot \omega_{BB} C_{BB})$$

The input voltage $V_{RF}$ received by the power amplifier in the upper and lower sidebands can be determined according to the following set of equations.

$$\begin{cases} V_{RF}(\omega_{LO} + \omega_{BB}) = \dfrac{I_{RF}}{Y_{USB}} \\ V_{RF}(\omega_{LO} - \omega_{BB}) = \dfrac{I_{RF}}{Y_{LSB}} \end{cases}$$

Here, $\omega_{BB}$ is the bandwidth of the baseband signal.

Since the real part of the equivalent impedance of the low-pass filter is independent of frequency, and the real part of the input impedance of the power amplifier is independent of frequency, this may result in a large difference in the gains at the upper sideband and the lower sideband, that is, $|V_{RF}(\omega_{LG}+\omega_{BB})| \neq |V_{RF}(\omega_{LO}-\omega_{BB})|$.

Based on the above analysis, the inventor of the present disclosure proposes that, if the real part of the impedance of the low-pass filter between the signal source (i.e., I-channel digital-to-analog converter and Q-channel digital-to-analog converter) and the passive quadrature mixer is also dependent of frequency, the gains of the mixer circuit with respect to the upper sideband and the lower sideband can be equal or nearly equal through proper adjustment and simulation. If an active device is provided in the low-pass filter, the equivalent resistance of the low-pass filter can be dependent of frequency, and thus the output admittance of the mixer circuit can contain a conductance dependent of frequency.

Based on this, the present disclosure provides a mixer circuit comprising: an I-channel digital-to-analog converter, a Q-channel digital-to-analog converter, a low-pass filter, and a passive quadrature mixer, the passive quadrature mixer is configured to generate a radio frequency signal based on an output of the I-channel digital-to-analog converter, an output of the Q-channel digital-to-analog converter, and the local oscillation signal, the low-pass filter is arranged ahead of the passive quadrature mixer, so that low-pass filtered signals between the I-channel non-inverting input terminal and the Q-channel non-inverting input terminal of the passive quadrature mixer and between the I-channel inverting input terminal and the Q-channel inverting input terminal of the passive quadrature mixer, respectively.

The low-pass filter includes an active device so that the output admittance of the mixer circuit contains a conductance dependent of frequency.

It should be noted that, the present disclosure does not limit the structure of the passive quadrature mixer, and those skilled in the art can design based on the prior art.

The present disclosure does not limit the type of the low-pass filter. For example, an RC low-pass filter circuit can be used in various embodiments.

The present disclosure does not limit the connections between the passive quadrature mixer and the I-channel digital-to-analog converter and between the passive quadrature mixer and the Q-channel digital-to-analog converter.

It should be noted that, in the prior art, capacitors are typically provided between an I-channel non-inverting input terminal and a Q-channel non-inverting input terminal of the passive quadrature mixer and between an I-channel inverting input terminal and a Q-channel inverting input terminal of the passive quadrature mixer. If the capacitor is connected in series with a voltage amplifier (i.e. the ground output terminal of the voltage amplifier is connected to one terminal of the capacitor), both the real and imaginary parts of the equivalent impedance between the other terminal of the capacitor and the ground input terminal of the voltage amplifier are dependent of frequency. In addition, one or more resistors are typically provided in the low-pass filter. Since the designing of low-pass filters between an I-channel non-inverting input terminal and a Q-channel non-inverting input terminal of the passive quadrature mixer and between an I-channel inverting input terminal and a Q-channel inverting input terminal of the passive quadrature mixer is common knowledge in the art, the internal structure of the low-pass filter is not particularly described in the present disclosure.

Figure 2:
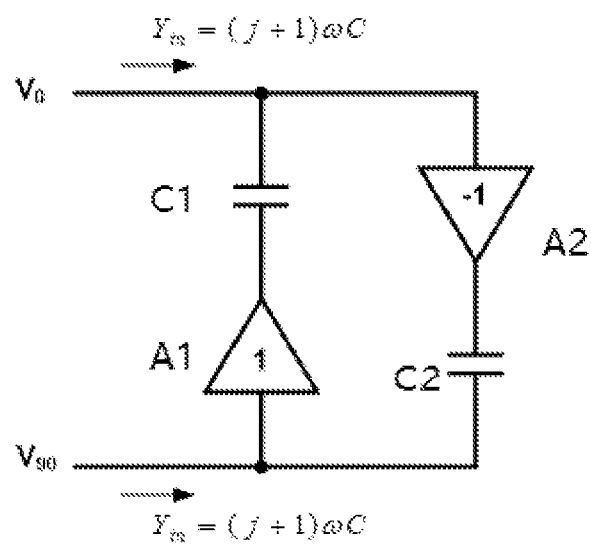
FIG. 2 is a circuit diagram of a complex capacitor according to an embodiment of the present disclosure.

Referring to FIG. 2, one embodiment of the present disclosure provides a complex capacitor including two circuit branches connected in parallel, one of which is formed by a capacitor C1 and a voltage amplifier A1 connected in series thereto, and the other of which is formed by a capacitor C2 and a voltage amplifier A2 connected in series thereto. Here, the signal directions of the voltage amplifiers A1 and A2 are opposite. If the signal applied across the complex capacitor is a signal with a phase difference of 90°, the real part of the equivalent impedance of the complex capacitor is dependent of frequency. In the accompanying drawings of the present disclosure, both of the voltage amplification factors of voltage amplifiers A1 and A2 are 1 or −1. In practical applications, the amplification factors of these voltage amplifiers can be flexibly selected based on the results of circuit simulation and adjustment.

Specifically, the admittance $Y_{in}$ of the complex capacitor shown in FIG. 2 is $Y_{in}=(j+1)\omega C$. In FIG. 2, both of $V_0$ and $V_{90}$ are ground input terminals, and the phase difference of the signals provided by the two terminals is 90°.

In some embodiments, the low-pass filter includes a first capacitor, a second capacitor, a first voltage amplifier, and a second voltage amplifier. Here, the two terminals of the first capacitor are respectively connected to the I-channel non-inverting input terminal of the passive quadrature mixer and the ground output terminal of the first voltage amplifier, the ground input terminal of the first voltage amplifier is connected to the Q-channel non-inverting input terminal of the passive quadrature mixer; the two terminals of the second capacitor are respectively connected to the Q-channel non-inverting input terminal of the passive quadrature mixer and the ground output terminal of the second voltage amplifier, the ground input terminal of the second voltage amplifier is connected to the I-channel non-inverting input terminal of the passive quadrature mixer.

That is, if a complex capacitor is connected between the I-channel non-inverting input terminal and the Q-channel non-inverting input terminal, the consistency between the gains of the mixer circuit with respect to the upper sideband and the lower sideband can be significantly improved.

In some embodiments, the low-pass filter includes: a first capacitor, a second capacitor, a first voltage amplifier, and a second voltage amplifier.

The two terminals of the first capacitor are respectively connected to the I-channel non-inverting input terminal of the passive quadrature mixer and the ground output terminal of the first voltage amplifier, and the ground input terminal of the first voltage amplifier is connected to the Q-channel non-inverting input terminal of the passive quadrature mixer.

The two terminals of the second capacitor are respectively connected to the Q-channel non-inverting input terminal of the passive quadrature mixer and the ground output terminal of the second voltage amplifier, the ground input terminal of the second voltage amplifier is connected to the I-channel non-inverting input terminal of the passive quadrature mixer.

Alternatively, one of the voltage amplification factors of the first voltage amplifier and the second voltage amplifier is a positive value and the other of the voltage amplification factors is of a negative value, so that the loads of the I-channel non-inverting output terminal and the Q-channel non-inverting output terminal are the same.

Figure 3A:
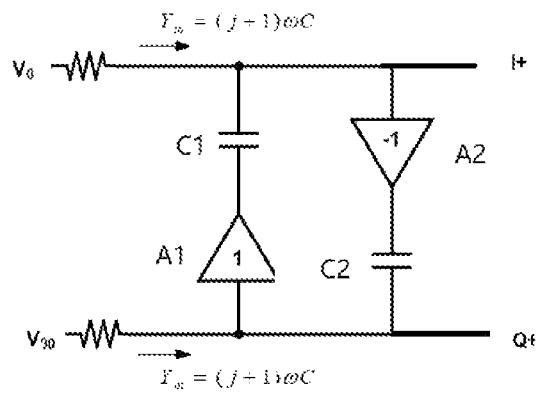
FIG. 3a is a circuit diagram of a mixer circuit according to an embodiment of the present disclosure.

Based on research, the inventor of the present disclosure found that, when the imaginary part of the input impedance of the load of the mixer circuit has a positive value (that is, the input impedance has an inductive characteristic), a complex capacitor can be connected between the I-channel non-inverting output terminal and the Q-channel non-inverting output terminal as shown in FIG. 3a, so that the real part of the output impedance of the mixer circuit increases with the increase of the frequency.

FIG. 3a only illustrates the connection between the I-channel non-inverting output terminal $V_0$ and the Q-channel non-inverting output terminal $V_{90}$ of the mixer circuit. It should be understood that, the I-channel non-inverting output terminal $V_0$ and the I-channel non-inverting input terminal I+ of the passive quadrature mixer are electrically connected, and there may be one or more resistors between the two terminals or the two terminals may be directly connected; the Q-channel non-inverting output terminal $V_{90}$ and the Q-channel non-inverting input terminal Q+ of the passive quadrature mixer are electrically connected, and there may be one or more resistors between the two terminals or the two terminals may be directly connected.

In the embodiment shown in FIG. 3a, a first capacitor C1 is connected in series with a first voltage amplifier A1, and a second capacitor C2 is connected in series with a second voltage amplifier A2. The voltage amplification factor of the first voltage amplifier A1 is a positive value, and the voltage amplification factor of the second voltage amplifier A2 is a negative value.

In the embodiment shown in FIG. 3a, the types of other parts of the low-pass filter and the internal structure of the passive quadrature mixer are not limited.

Figure 3B:
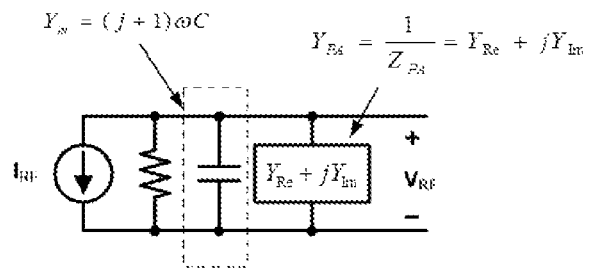
FIG. 3b is an equivalent circuit of the mixer circuit shown in FIG. 3a in the current source mode.

Since the low-pass filter contains complex capacitors, referring to FIG. 3b, the real part of the equivalent admittance of the complex capacitor in the equivalent model of the current source of the mixer circuit increases with the increase of the frequency.

In the current source model of the mixer circuit, the output admittance $Y_{BB}$ of the current source can be determined according to the equation below.

$$Y_{BB} = \frac{1}{\alpha \cdot R_{BB}} + \beta \cdot (j+1)(\omega - \omega_{LO}) C_{BB}$$

The admittance $Y_{USB}$ of all loads of the current source at the upper sideband and the admittance $Y_{LSB}$ of all loads of the current source at the lower sideband can be expressed according to the equations below.

$$\begin{cases} Y_{BB}(\omega_{LO} + \omega_{BB}) + Y_{PA}(\omega_{LO} + \omega_{BB}) = Y_{USB} = \\ \frac{1}{\alpha \cdot R_{BB}} + Y_{Re} + \beta \cdot \omega_{BB} C_{BB} + j(Y_{Im} + \beta \cdot \omega_{BB} C_{BB}) \\ Y_{BB}(\omega_{LO} - \omega_{BB}) + Y_{PA}(\omega_{LO} - \omega_{BB}) = Y_{LSB} = \\ \frac{1}{\alpha \cdot R_{BB}} + Y_{Re} - \beta \cdot \omega_{BB} C_{BB} + j(Y_{Im} - \beta \cdot \omega_{BB} C_{BB}) \end{cases}$$

At the upper sideband and the lower sideband, the input voltage $V_{RF}$ received by the load can be determined according to the following set of equations:

$$\begin{cases} V_{RF}(\omega_{LO} + \omega_{BB}) = \dfrac{I_{RF}}{Y_{USB}} \\ V_{RF}(\omega_{LO} - \omega_{BB}) = \dfrac{I_{RF}}{Y_{LSB}} \end{cases}$$

If the capacitance value of the capacitor and/or voltage amplification factor of the voltage amplifier in a complex capacitor is adjusted, the gains of the mixer circuit with respect to the upper sideband and the lower sideband can be equal, that is, $|V_{RF}(\omega_{LO}+\omega_{BB})|=|V_{RF}(\omega_{LO}-\omega_{BB})|$. It is obvious that, even if other factors are considered, the two gains may not be completely equal, the two gains can be nearly equal through adjustment.

Figure 4A:
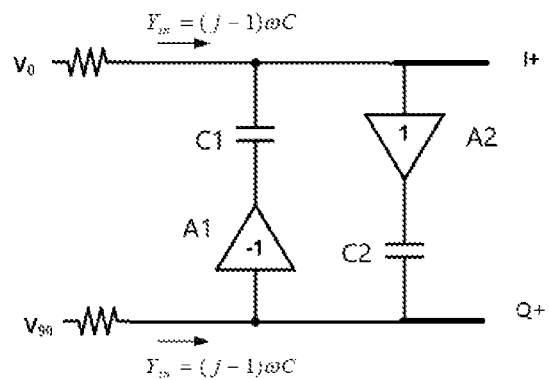
FIG. 4a is a circuit diagram of a mixer circuit according to an embodiment of the present disclosure.

Based on research, the inventor of the present disclosure found that, when the imaginary part of the input impedance of the load of the mixer circuit has a negative value (that is, the input impedance has a capacitive characteristic), a complex capacitor can be connected between the I-channel non-inverting input terminal I+ and the Q-channel non-inverting input terminal Q+ in the manner shown in FIG. 4a, so that the real part of the output impedance of the mixer circuit decreases with the increase of the frequency.

FIG. 4a only illustrates the connection between the I-channel non-inverting output terminal $V_0$ and the Q-channel non-inverting output terminal $V_{90}$ in the mixer circuit. It should be understood that, the I-channel non-inverting output terminal $V_0$ and the I-channel non-inverting input terminal I+ of the passive quadrature mixer are electrically connected, and there may be one or more resistors between the two terminals or the two terminals may be directly connected; the Q-channel non-inverting output terminal $V_{90}$ and the Q-channel non-inverting input terminal Q+ of the passive quadrature mixer are electrically connected, and there may be one or more resistors between the two terminals or the two terminals may be directly connected.

In the embodiment shown in FIG. 4a, a first capacitor C1 is connected in series with a first voltage amplifier A1, and a second capacitor C2 is connected in series with a second voltage amplifier A2. The voltage amplification factor of the first voltage amplifier A1 is a negative value, and the voltage amplification factor of the second voltage amplifier A2 is a positive value.

In the embodiment shown in FIG. 4a, the types of other parts of the low-pass filter and the internal structure of the passive quadrature mixer are not limited.

Figure 4B:
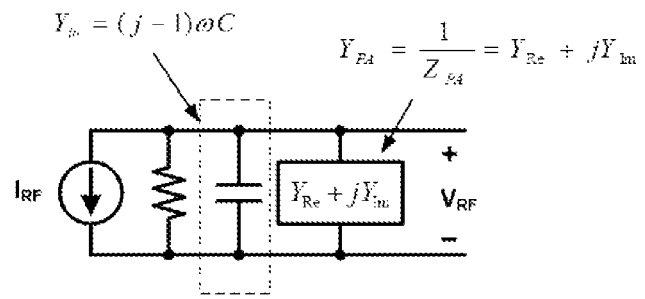
FIG. 4b is an equivalent circuit of the mixer circuit shown in FIG. 4a in the current source mode.

Since the low-pass filter contains complex capacitors, referring to FIG. 4b, the real part of the equivalent admittance of the complex capacitor in the equivalent model of the current source of the mixer circuit decreases with the increase of frequency.

In the current source model of the mixer circuit, the output admittance $Y_{BB}$ of the current source can be determined according to the equation below.

$$Y_{BB} = \frac{1}{\alpha \cdot R_{BB}} + \beta \cdot (j+1)(\omega - \omega_{LO})C_{BB}$$

The admittance $Y_{USB}$ of all loads of the current source at the upper sideband and the admittance $Y_{LSB}$ of all loads of the current source at the lower sideband can be expressed according to the equations below.

$$\begin{cases} Y_{BB}(\omega_{LO} + \omega_{BB}) + Y_{PA}(\omega_{LO} + \omega_{BB}) = Y_{USB} = \\ \frac{1}{\alpha \cdot R_{BB}} + Y_{Re} - \beta \cdot \omega_{BB} C_{BB} + j(Y_{Im} + \beta \cdot \omega_{BB} C_{BB}) \\ Y_{BB}(\omega_{LO} - \omega_{BB}) + Y_{PA}(\omega_{LO} - \omega_{BB}) = Y_{LSB} = \\ \frac{1}{\alpha \cdot R_{BB}} + Y_{Re} + \beta \cdot \omega_{BB} C_{BB} + j(Y_{Im} - \beta \cdot \omega_{BB} C_{BB}) \end{cases}$$

At the upper sideband and the lower sideband, the input voltage $V_{RF}$ received by the load can be determined according to the following set of equations:

$$\begin{cases} V_{RF}(\omega_{LO} + \omega_{BB}) = \frac{I_{RF}}{Y_{USB}} \\ V_{RF}(\omega_{LO} - \omega_{BB}) = \frac{I_{RF}}{Y_{LSB}} \end{cases}$$

If the capacitance value of the capacitor and/or voltage amplification factor of the voltage amplifier in a complex capacitor is adjusted, the gains of the mixer circuit with respect to the upper sideband and the lower sideband can be equal, that is, $|V_{RF}(\omega_{LO}+\omega_{BB})|=|V_{RF}(\omega_{LO}-\omega_{BB})|$. It is obvious that, even if other factors are considered, the two gains may not be completely equal, and the two gains can be nearly equal through adjustment.

It should be noted that, in FIGS. 3a and 4a, a capacitor (not shown) is also provided between the I-channel inverting input terminal and the Q-channel inverting input terminal in the low-pass filter, the capacitor may be a conventional capacitor instead of the complex capacitor proposed in the present disclosure.

In some embodiments, the low-pass filter further includes: a third capacitor, a fourth capacitor, a third voltage amplifier, and a fourth voltage amplifier.

The two terminals of the third capacitor are respectively connected to the I-channel inverting input terminal of the passive quadrature mixer and the ground output terminal of the third voltage amplifier, the ground input terminal of the third voltage amplifier is connected to the Q-channel inverting input terminal of the passive quadrature mixer;

The two terminals of the fourth capacitor are respectively connected to the Q-channel inverting input terminal of the passive quadrature mixer and the ground output terminal of the fourth voltage amplifier, and the ground input terminal of the fourth voltage amplifier is connected to the I-channel inverting input terminal of the passive quadrature mixer.

Alternatively, both of the voltage amplification factors of the first voltage amplifier and the third voltage amplifier are of positive values, and both of the voltage amplification factors of the second voltage amplifier and the fourth voltage amplifier are of negative values.

Alternatively, both of the voltage amplification factors of the first voltage amplifier and the third voltage amplifier are of negative values, and both of the voltage amplification factors of the second voltage amplifier and the fourth voltage amplifier are of positive values, so that the loads of the four output terminals of the I-channel and Q-channel are the same.

Figure 5:
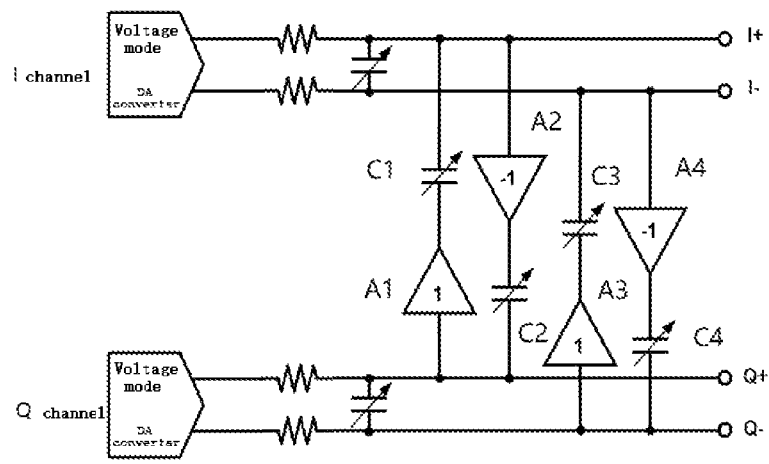
FIG. 5 to FIG. 8 are respectively circuit diagrams of mixer circuits according to the embodiment of the present disclosure.

In the circuit diagram shown in FIG. 5, both the I-channel digital-to-analog converter and the Q-channel digital-to-analog converter are in voltage mode (V-Mode DAC), and the passive quadrature mixer in the mixer circuit is not shown, the imaginary part of the input admittance of the power amplifier connected to the passive quadrature mixer is a negative value. FIG. 5 only illustrates an I-channel non-inverting input terminal I+, an I-channel inverting input terminal I−, a Q-channel non-inverting input terminal I+, and a Q-channel inverting input terminal I− of the passive quadrature mixer. The four capacitors contain two complex capacitors, and each complex capacitor contains two capacitors and two voltage amplifiers. The first capacitor C1 is connected in series with the first voltage amplifier A1 (the voltage amplification factor is a positive value), the second capacitor C2 is connected in series with the second voltage amplifier A2 (the voltage amplification factor is a negative value), the third capacitor C3 is connected in series with the third voltage amplifier A3 (the voltage amplification factor is a positive value), and the fourth capacitor C4 is connected in series with the fourth voltage amplifier A4 (the voltage amplification factor is a negative value).

Figure 6:
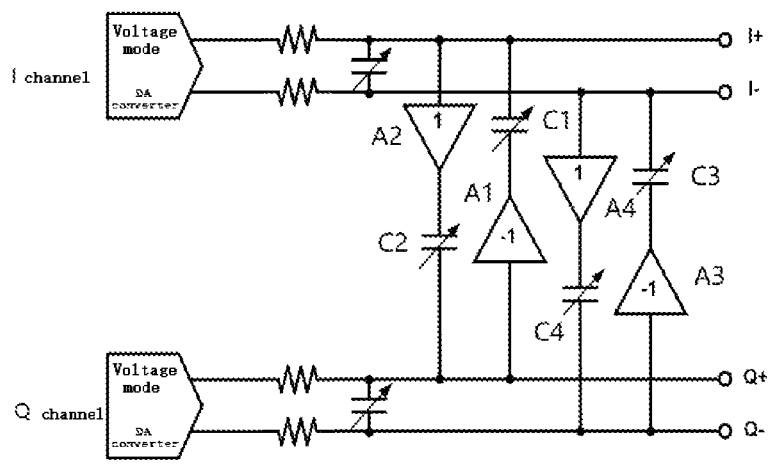

In the circuit diagram shown in FIG. 6, both the I-channel digital-to-analog converter and the Q-channel digital-to-analog converter are in voltage mode (V-Mode DAC), and the passive quadrature mixer in the mixer circuit is not shown, the imaginary part of the input admittance of the power amplifier connected to the passive quadrature mixer is a positive value. FIG. 6 only illustrates an I-channel non-inverting input terminal I+, an I-channel inverting input terminal I−, a Q-channel non-inverting input terminal I+, and a Q-channel inverting input terminal I− of the passive quadrature mixer. The four capacitors in the low-pass filter contain two complex capacitors, and each complex capacitor contains two capacitors and two voltage amplifiers. The first capacitor C1 is connected in series with the first voltage amplifier A1 (the voltage amplification factor is a negative value), the second capacitor C2 is connected in series with the second voltage amplifier A2 (the voltage amplification factor is a positive value), the third capacitor C3 is connected in series with the third voltage amplifier A3 (the voltage amplification factor is a negative value), and the fourth capacitor C4 is connected in series with the fourth voltage amplifier A4 (the voltage amplification factor is a positive value).

Figure 7:
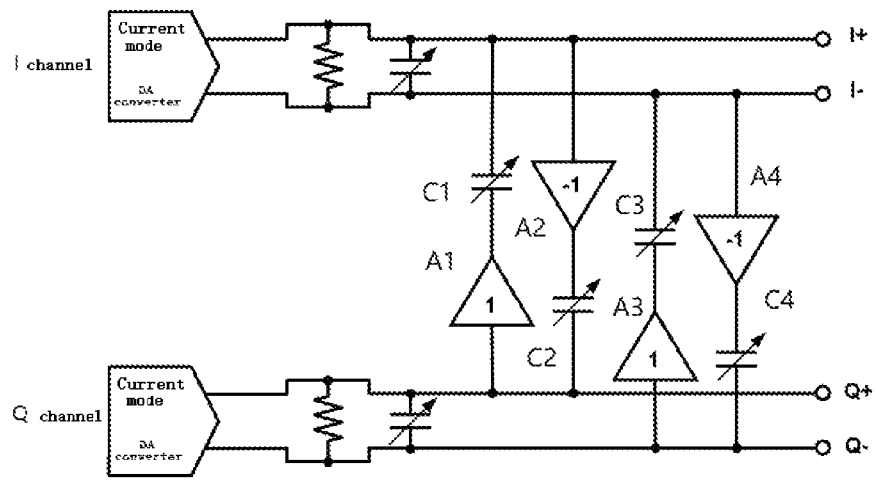

In the circuit diagram shown in FIG. 7, both the I-channel digital-to-analog converter and the Q-channel digital-to-analog converter are in current mode (I-Mode DAC), and imaginary part of the input admittance of the power amplifier connected to the passive quadrature mixer is a negative value. FIG. 7 only illustrates the I-channel non-inverting input terminal I+, the I-channel inverting input terminal I−, the Q-channel non-inverting input terminal I+, and the Q-channel inverting input terminal I− of the passive quadrature mixer. The four capacitors in the low-pass filter contain two complex capacitors, and each complex capacitor contains two capacitors and two voltage amplifiers. The first capacitor C1 is connected in series with the first voltage amplifier A1 (the voltage amplification factor is a positive value), the second capacitor C2 is connected in series with the second voltage amplifier A2 (the voltage amplification factor is a negative value), the third capacitor C3 is connected in series with the third voltage amplifier A3 (the voltage amplification factor is a positive value), the fourth capacitor C4 is connected in series with the fourth voltage amplifier A4 (the voltage amplification factor is a negative value).

Figure 8:
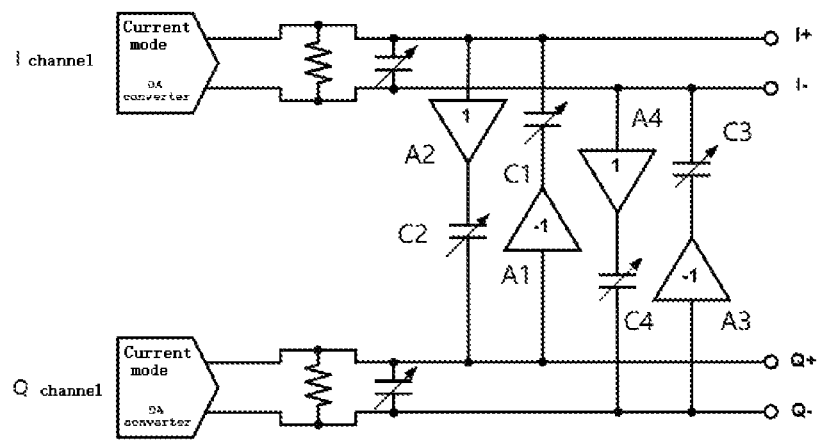

In the circuit diagram shown in FIG. 8, both the I-channel digital-to-analog converter and the Q-channel digital-to-analog converter are in current mode (I-Mode DAC), and the passive quadrature mixer in the mixer circuit is not shown, and the imaginary part of the input admittance of the power amplifier connected to the passive quadrature mixer is a positive value. FIG. 8 only illustrates an I-channel non-inverting input terminal I+, an I-channel inverting input terminal I−, a Q-channel non-inverting input terminal I+, and a Q-channel inverting input terminal I− of the passive quadrature mixer. The four capacitors in the low-pass filter contain two complex capacitors, and each complex capacitor contains two capacitors and two voltage amplifiers. The first capacitor C1 is connected in series with the first voltage amplifier A1 (the voltage amplification factor is a negative value), the second capacitor C2 is connected in series with the second voltage amplifier A2 (the voltage amplification factor is a positive value), the third capacitor C3 is connected in series with the third voltage amplifier A3 (the voltage amplification factor is a negative value), and the fourth capacitor C4 is connected in series with the fourth voltage amplifier A4 (the voltage amplification factor is a positive value).

The various embodiments in the present disclosure are described in a progressive manner, and the same or similar parts between the various embodiments can be referred to each other, and each embodiment focuses on the differences from other embodiments.

The protection scope of the present disclosure is not limited to the above embodiments. It is obvious that, those skilled in the art can make various amendments and modifications to the present disclosure without departing from the scope and spirit of the present disclosure. If these amendments and modifications fall within the scope of the claims of the present disclosure and its equivalent technology, the present disclosure is also intended to include these amendments and modifications.

What is claimed is:

1. A mixer circuit comprising an I-channel digital-to-analog converter, a Q-channel digital-to-analog converter, a low-pass filter, and a passive quadrature mixer, wherein
   the passive quadrature mixer is configured to generate a radio frequency signal based on an output of the I-channel digital-to-analog converter, an output of the Q-channel digital-to-analog converter and a local oscillation signal,
   the low-pass filter is arranged ahead of the passive quadrature mixer, so that low-pass filtered signals are received between an I-channel non-inverting input terminal and a Q-channel non-inverting input terminal of the passive quadrature mixer and between an I-channel inverting input terminal and a Q-channel inverting input terminal of the passive quadrature mixer, respectively,
   wherein the low-pass filter includes an active device, so that an output admittance of the mixer circuit contains conductance dependent of frequency,
   wherein the low-pass filter comprises two voltage amplifiers that are connected in parallel between the I-channel non-inverting input terminal and the Q-channel non-inverting input terminal and have respective signal directions opposite to each other.

2. The mixer circuit of claim 1, wherein the low-pass filter comprises a first capacitor, a second capacitor, a first voltage amplifier, and a second voltage amplifier,
   two terminals of the first capacitor are respectively connected to the I-channel non-inverting input terminal of the passive quadrature mixer and a ground output terminal of the first voltage amplifier, and a ground input terminal of the first voltage amplifier is connected to the Q-channel non-inverting input terminal of the passive quadrature mixer,
   two terminals of the second capacitor are respectively connected to the Q-channel non-inverting input terminal of the passive quadrature mixer and a ground output terminal of the second voltage amplifier, and a ground input terminal of the second voltage amplifier is connected to the I-channel non-inverting input terminal of the passive quadrature mixer.

3. The mixer circuit of claim 2, wherein one of voltage amplification factors of the first voltage amplifier and the second voltage amplifier is a positive value and the other of the voltage amplification factors is of a negative value.

4. The mixer circuit of claim 2, wherein the low-pass filter further comprises: a third capacitor, a fourth capacitor, a third voltage amplifier, and a fourth voltage amplifier,
   two terminals of the third capacitor are respectively connected to the I-channel inverting input terminal of the passive quadrature mixer and a ground output terminal of the third voltage amplifier, and a ground input terminal of the third voltage amplifier is connected to the Q-channel inverting input terminal of the passive quadrature mixer,
   two terminals of the fourth capacitor are respectively connected to the Q-channel inverting input terminal of the passive quadrature mixer and a ground output terminal of the fourth voltage amplifier, and a ground input terminal of the fourth voltage amplifier is connected to the I-channel inverting input terminal of the passive quadrature mixer.

5. The mixer circuit of claim 4, wherein both of voltage amplification factors of the first voltage amplifier and the third voltage amplifier are of positive values, and both of voltage amplification factors of the second voltage amplifier and the fourth voltage amplifier are of negative values; or both of the voltage amplification factors of the first voltage amplifier and the third voltage amplifier are of negative values, and both of the voltage amplification factors of the second voltage amplifier and the fourth voltage amplifier are of positive values.

6. A transmitter comprising an antenna, a power amplification circuit, and the mixer circuit of claim 1, wherein the passive quadrature mixer is configured to provide the mixed radio frequency signal to the power amplification circuit, and the power amplification circuit is configured to amplify the received radio frequency signal and provide the amplified radio frequency signal to the antenna.

7. A communication device comprising the transmitter of claim 6.

\* \* \* \* \*